United States Patent
Palagonia et al.

[11] Patent Number: 6,037,661
[45] Date of Patent: Mar. 14, 2000

[54] MULTICHIP MODULE

[75] Inventors: Anthony M. Palagonia, Underhill; John E. Cronin, Milton, both of Vt.

[73] Assignee: International Business Machines, Armonk, N.Y.

[21] Appl. No.: 08/771,598

[22] Filed: Dec. 20, 1996

[51] Int. Cl.[7] .............................................. H01L 31/0232
[52] U.S. Cl. ...................... 257/723; 257/700; 257/704; 257/787
[58] Field of Search ................................. 257/700, 701, 257/704, 723, 787

[56] References Cited

U.S. PATENT DOCUMENTS

| | | | |
|---|---|---|---|
| 5,273,938 | 12/1993 | Lin et al. | 437/207 |
| 5,295,045 | 3/1994 | Kitano et al. | 361/813 |
| 5,318,926 | 6/1994 | Dlugokecki et al. | 437/210 |
| 5,347,429 | 9/1994 | Kohno et al. | 361/813 |
| 5,366,933 | 11/1994 | Golwalkar et al. | 437/215 |
| 5,479,051 | 12/1995 | Waki et al. | 257/724 |
| 5,523,608 | 6/1996 | Kitaoka et al. | 257/723 |
| 5,793,101 | 8/1998 | Kuhn | 257/723 |

*Primary Examiner*—Carl Whitehead, Jr
*Assistant Examiner*—Roy Potter
*Attorney, Agent, or Firm*—Robert A. Walsh

[57] ABSTRACT

A semiconductor device which includes a first semiconductor chip mounted on top of a lead frame which is molded within a plastic body. During the molding process a cavity is formed on the bottom of the lead frame. After testing or burn-in of the first chip a second semiconductor chip is mounted and electrically connected to the lead frame. The second chip may then be sealed within the cavity to form a multichip module.

13 Claims, 2 Drawing Sheets

MULTICHIP MODULE

BACKGROUND OF THE INVENTION

1. Field of the Invention

The present invention generally relates to semiconductor devices, and, more particularly, to a semiconductor package which has a plurality of semiconductor chips.

2. Description of the Prior Art

To satisfy demands to reduce the size of electronic equipments and the like, a semiconductor device having the chip-on-chip structure has been proposed. The semiconductor device having the chip-on-chip structure has a plurality of semiconductor chips mounted within a single package. However, when two or more chips are mounted into a single package, they are usually mounted together in a single package using resin molding techniques. In such a package, if one of the chips fails for any reason the whole package must be discarded.

A conventional semiconductor package having a plurality of semiconductor chips more specifically, first and second semiconductor chips have been described in the prior art. Typically a chip is placed in a central opening of a lead frame so that a surface of the chip having circuits formed thereon face in one direction. Similarly, a second semiconductor chip is provided at the central opening of the lead frame so that a surface having circuits formed thereon faces in the same direction as the first chip. An inner lead bonding is used so that the first semiconductor chip is connected to bumps at lead ends. In addition, an inner lead bonding is made so that the second semiconductor chip is connected to bumps at respective ends of another set of lead ends.

The tape leads are bent so that a second surface of the first semiconductor chip is approximately parallel to the first surface of the second semiconductor chip. An outer lead bonding is made so that other ends of both sets of the tape leads are connected to the lead frame by thermocompression bonding. In addition, a transfer molding may be carried out to make a package in which both chips are encased in a mold resin.

This type of configuration is shown and described in U.S. Pat. No. 5,479,051 which is included herein by reference. The other two packages may be found in U.S. Pat. Nos. 5,318,926; 5,366,933; 5,347,429; 5,295,045 and 5,273,938.

U.S. Pat. No. 5,273,938 teaches a method of forming a multichip package by attaching a first chip to one side of a conductive trace while a transfer tape covers the other side. The transfer tape acts as one wall of a mold during encapsulation. The tape is removed, a second chip is attached to the reverse side of the conductive traces and a second molding process is performed, encapsulating the second chip. Because of thermal stress usefulness of this package is limited to chips of identical size.

U.S. Pat. No. 5,295,045 teaches a multichip module with the chips stacked vertically. All chips are encapsulated at the same time.

U.S. Pat. No. 5,318,926 teaches a method of exposing the leads of a fully formed module having a chip inside to allow replacement of the chip or rewiring. The cavity is sealed with a polymeric insulating material.

U.S. Pat. No. 5,347,429 teaches encapsulating simultaneously two chips in the same package.

U.S. Pat. No. 5,366,933 teaches a multi-chip package which is created using two molding steps. The chips are attached only by chip on carrier technology and they are mounted back to back limiting usefulness to identical chip sizes.

U.S. Pat. No. 5,479,051 teaches a dual chip package using insulating tape to prevent chips from being moved by the material flow during molding.

In all of the modules described, the chips are permanently bonded or affixed inside a module. As a result, if one chip fails, it would be difficult to replace and therefore the whole package must be discarded. This would be a very expensive procedure if one of the chips is a microprocessor. Accordingly, a technique for packaging microprocessors with other chips is required.

Currently, in the microprocessor industry, the standard practice is to mount the chips to the motherboard of the PC. Major microprocessor manufacturers have been using ceramic multichip modules (MCM) with C4 type connections for a number of years. Testing, burn-in, debug, and rework are of major concern for producing such packages where the solution to such problems require chip hardware changes. It can be foreseen that a need will arise in the industry for a solution that does not require a circuit solution or the relatively expensive MCM packages in use today.

SUMMARY OF THE INVENTION

Accordingly, it is a general object of the present invention to provide a novel and useful semiconductor device in which the problems described above are eliminated.

Another and more specific object of the present invention is to provide a semiconductor device comprising at least a two chip module where one of the chips may be easily attached or removed.

Still another object of the present invention is to create a module to facilitate testing and burn-in of a module having multiple chips.

A further object of the present invention is to overcome the difficulty in determining which chip has failed without depackaging or expensive test circuits on board the chips. This problem becomes most important in the case of an expensive chip being packaged with an inexpensive chip or chips. The case of the microprocessor being used in combination with other chips becomes critical because of the high cost of the microprocessor chip.

BRIEF DESCRIPTION OF THE DRAWINGS

The present invention is illustrated by way of example and not limited in the figures of the accompanying drawings in which like references indicate similar elements; and in which.

DESCRIPTION OF THE PREFERRED EMBODIMENT

Figure 1:
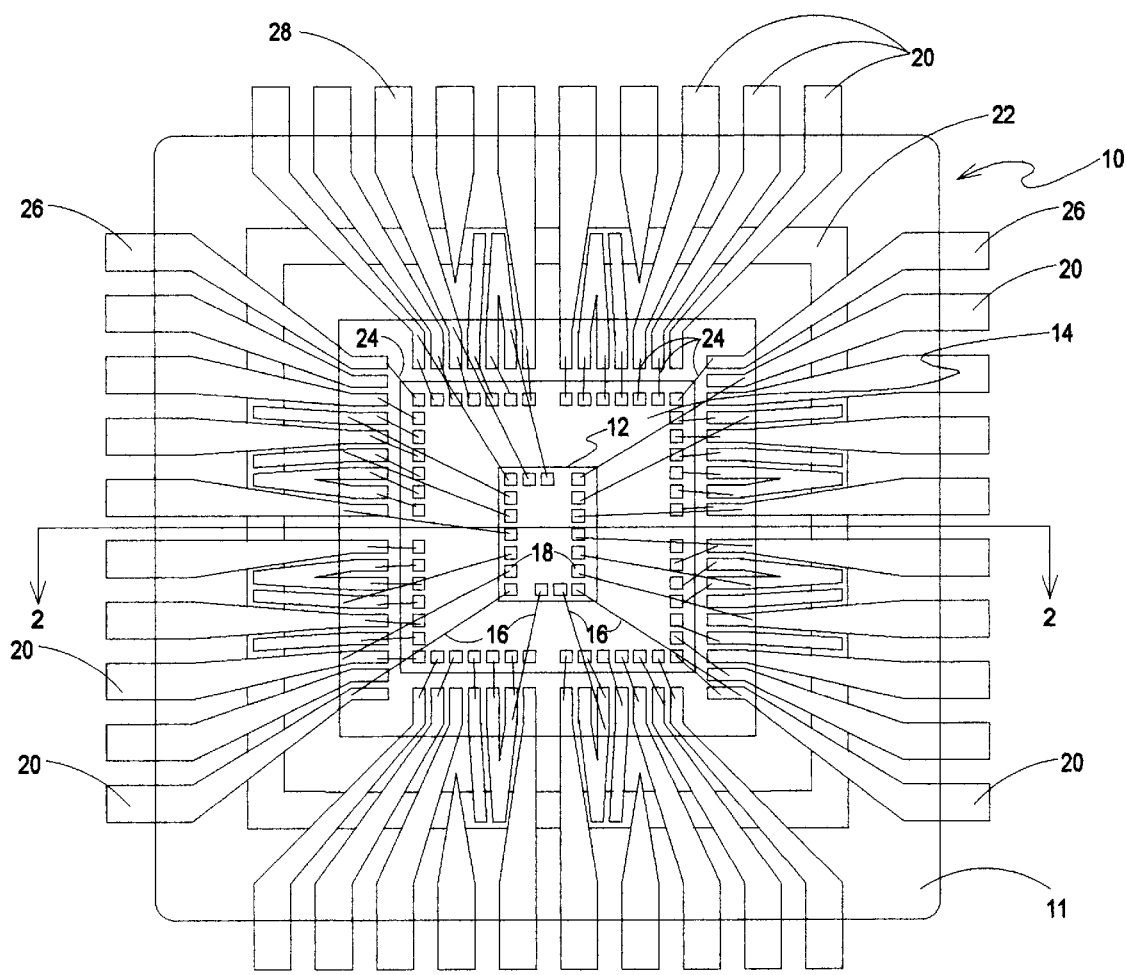
FIG. 1 is a plan view of a two chip module in accordance with the present invention.

In FIGS. 1, 2, 3 and 4, the preferred embodiment of the present invention is shown to be a plastic quad flatpak-type package 10 constructed so as to allow a first chip 14 to be completely packaged. After test/burn-in of the first chip, a second chip 12 is connected and packaged within the existing package body. According to the present invention, a cavity 13 is molded under the location of the chip 14 such as to expose a portion of the leads 20 and 26. After wirebonding, the cavity is sealed either permanently or with removability if fixable modules are desired.

Attention is directed to FIG. 1, a top view of the module 10 according to the present invention which is shown as if one could see through the plastic material 11. The relative size of the chips 12 and 14 and exact location are shown for illustration purposes only. It is understood that the chips 12 and 14 could be offset from one another, there could be more than one chip, and there could be more than one cavity. Where 16 connect chip 12 pads 18 to leads 20 on lead frame 22. Wires 24 connect the second chip 14 to leads 26 on lead frame 22. Lead 28 has wire connections to both chips. In the case of two chips in the cavity, it is possible to wire some of the chip pads to the leads and some to the other chip (direct wirebond of chip to chip). Direct chip wirebond of chip to chip would be useful, for example, if two L2 cache chips were to be used. An option shown is the ability to use short fingers to wire different pads of the same chip together without connection to an outside pin. An option not shown is the ability to use short fingers to wire the first chip 12 to the second chip 14 without connection to an outside pin. To do either option requires a lead frame with a band of tape holding the leads long and short together.

Figure 2:
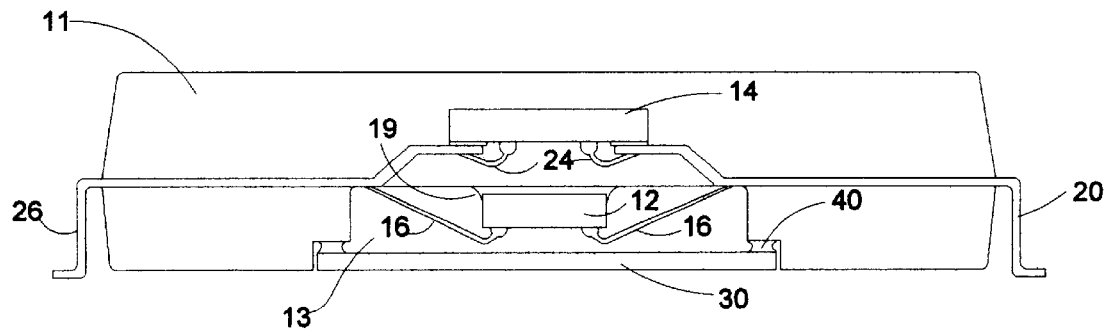
FIG. 2 is a cross-sectioned view of a portion of FIG. 1 showing chips mounted by lead on chip (LOC) technology.
Figure 3:
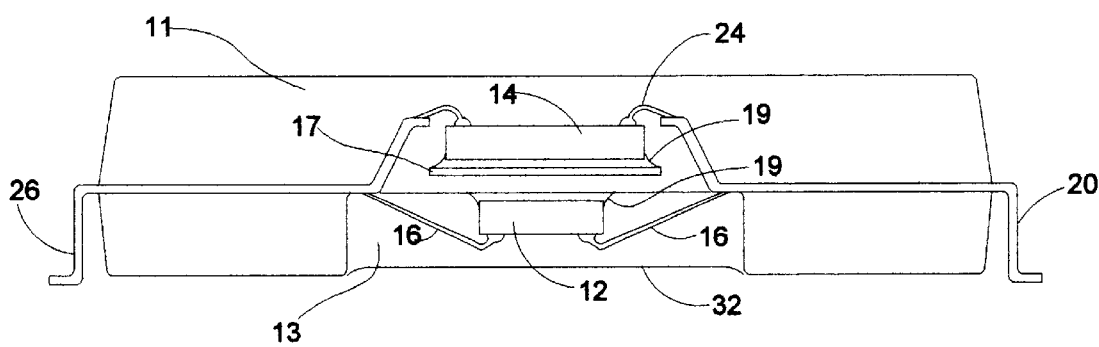
FIG. 3 is a cross-sectional view of an alternative embodiment of the present invention shown in FIG. 2.

In FIG. 2, the leads 20 are bent down to the parting line so a portion of the lead can be exposed by the mold. The module 10 can either be finished and tested or the second chip 12 could be put on at once, depending upon the application. If the first chip 14 is a microprocessor, the package would be completed, that is, formed and trimmed. After a possible cleanup step to remove residual plastic, the second chip 12 is then glued in place by epoxy 17 and wirebonded. The chip 12 can be tested now and then sealed in cavity 13. For the embodiment shown in FIG. 2, a lid 30 is used to seal chip 12 into the cavity 13. In FIG. 3, the entire cavity is filled with material 32, usually an epoxy, for sealing purposes. Either method is applicable to either embodiment. If not permanently sealed, the second chip could be removed and another put in its place. Seal materials can be made removable if field return rework is a desired feature.

FIG. 3 illustrates a module for conventional chips using a standard carrier construction. The chip carrier 17 may be placed as shown with plastic 11 under the chip 14, or it may be placed in the same plane as the leads (not shown), allowing the second chip 12 to be mounted to it as well. Both chips may be mounted with an epoxy 19. In the case of both chips mounted to the carrier, the epoxy may be conductive (Ag epoxy), in which case the chips would intimately share a common ground.

Figure 4:
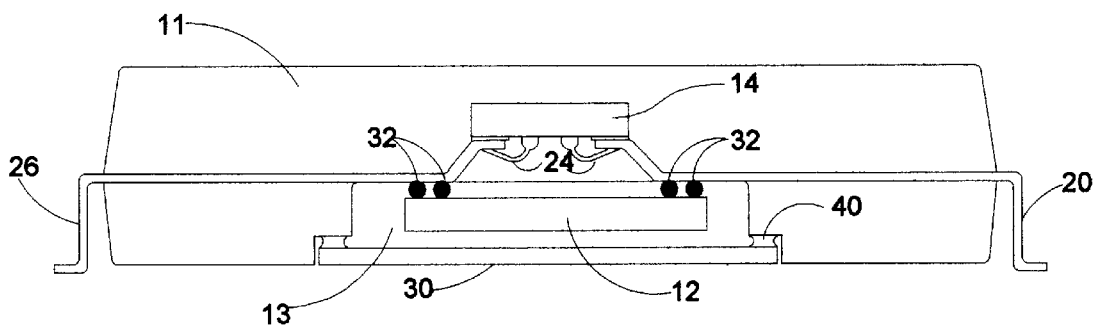
FIG. 4 is a cross-sectional view of an alternative embodiment of the present invention showing a C4 bonded chip.

Illustrated in FIG. 4 is an alternative embodiment that allows the second chip 12 to use a C4 ball 32 to bond the chip. Normally, C4 bonded chips are subject to solder ball cracking when embedded in typical plastic molding compounds. Because of the preferred arrangement in a cavity, this problem can be avoided. In the first embodiment of the invention, the attachment is as shown using lid 30 to seal the cavity using sealent 40. It should be noted that a conductive paste may be placed between the top of the chip 12 and the lid 30 and a heat sink (not shown) attached to the lid. The mounting feet would be reversed from that shown. In the epoxy filled embodiment of the invention shown in FIG. 2, it is only necessary to use a $SiO_2$ filled epoxy at least under the chip if not for the whole cavity.

In all the above embodiments of the module having the two chips, an amount of molding compound exists between them. That is, the first chip is surrounded by package body and the second chip is epoxied to mold compound, not the back of the first chip or to a lead frame or chip carrier portion of a lead frame, though this option is described. This permits the two chips of different sizes to be put in the same package. It has been found that mounting different size back-to-back chips on a common chip carrier portion of the lead frame results in stresses that can damage the package and/or chips. The option is only feasible when the chips are the same size.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A module comprising:

A lead frame having a plurality of fingers, each finger having an inner portion, an inner and outer intermediate portion and an outer portion, the outer intermediate portion having a top and bottom surface;

a first integrated circuit die electrically coupled to said inner portion of said fingers;

a molded plastic body having first portion encapsulating said first integrated circuit die and said inner, inner intermediate, top surface of the outer intermediate portions of said lead frame and a second portion encapsulating a portion of the bottom surface of the outer intermediate portions of the lead frame, said second portion having a cavity defined by sidewalls perpendicular to the outer intermediate portion of said fingers and a bottom substantially coplanar with the outer intermediate portion of said fingers;

wherein said first integrated circuit die is positioned within first portion a distance from said bottom of said cavity; and a second integrated circuit die positioned within said cavity and electrically coupled to the bottom surface of said inner intermediate portion of said fingers.

2. The module of claim 1 wherein the second die is sealed in the cavity by a lid.

3. The module of claim 1 wherein the cavity is filled with epoxy.

4. The module of claim 1 wherein the second die is coupled to the lead frame by C4 solder balls.

5. The module of claim 1 wherein the second die is coupled to the lead frame by wire bonding.

6. The module of claim 4 wherein the first die is coupled to the lead frame by wire bonding.

7. The module of claim 4 wherein the first die is coupled to the lead frame by C4 solder balls.

8. The module of claim 6 wherein the cavity is filled with epoxy.

9. The module of claim 6 wherein the second die is sealed in the cavity by a lid.

10. A module comprising:

A lead frame having a plurality of fingers, each finger having an inner portion, an inner and outer intermediate portion and an outer portion, the outer intermediate portion having a top and bottom surface;

a first integrated circuit die electrically coupled to said inner portion of said fingers;

a molded plastic body having first portion encapsulating said first integrated circuit die and said inner, inner intermediate, top surface of the outer intermediate portions of said lead frame and a second portion encapsulating a portion of the bottom surface of the outer intermediate portions of the lead frame, said second portion having a cavity defined by sidewalls perpendicular to the outer intermediate portion of said fingers and a bottom substantially coplanar with the outer intermediate portion of said fingers;

a second integrated circuit die positioned within said cavity and electrically coupled to the bottom surface of said inner intermediate portion of said fingers; and wherein the second die is sealed in the cavity by a lid and the cavity is filled with epoxy.

11. The module of claim 10 wherein the second die is coupled to the lead frame by C4 solder balls.

12. The module of claim 11 wherein the first die is coupled to the lead frame by wire bonding.

13. The module of claim 11 wherein the first die is coupled to the lead frame by C4 solder balls.

* * * * *